(12) United States Patent
Weaver et al.

(10) Patent No.: US 9,655,199 B2
(45) Date of Patent: May 16, 2017

(54) FOUR COMPONENT PHOSPHORESCENT OLED FOR COOL WHITE LIGHTING APPLICATION

(75) Inventors: Michael Weaver, Princeton, NJ (US); Xin Xu, Ann Arbor, MI (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 544 days.

(21) Appl. No.: 13/483,738

(22) Filed: May 30, 2012

(65) Prior Publication Data
US 2013/0320837 A1    Dec. 5, 2013

(51) Int. Cl.
*H05B 33/14* (2006.01)
*H01L 27/32* (2006.01)
*H01L 51/00* (2006.01)
*H01L 51/50* (2006.01)

(52) U.S. Cl.
CPC .......... *H05B 33/14* (2013.01); *H01L 27/3209* (2013.01); *H01L 51/504* (2013.01); *H05B 33/145* (2013.01); *C09K 2211/1007* (2013.01); *C09K 2211/1029* (2013.01); *C09K 2211/1044* (2013.01); *C09K 2211/185* (2013.01); *H01L 51/0071* (2013.01); *H01L 51/0072* (2013.01); *H01L 51/0074* (2013.01); *H01L 51/0085* (2013.01); *H01L 51/5016* (2013.01)

(58) Field of Classification Search
CPC .............................. H05B 33/145; H05B 33/14
USPC ........... 313/498–512; 315/169.3; 345/36, 45, 345/76; 445/3, 23, 52
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |

(Continued)

FOREIGN PATENT DOCUMENTS

WO    WO 2010/039938    4/2010

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Nimeshkumar Patel
*Assistant Examiner* — Christopher Raabe
(74) *Attorney, Agent, or Firm* — Morris & Kamley LLP

(57) ABSTRACT

A light emitting system is provided including a first organic light emitting device. The first organic light emitting device includes an anode, a cathode, a first organic emitting layer disposed between the anode and the cathode, and a second organic emitting layer disposed between the anode and the cathode. The first organic emitting layer and the second organic emitting layer each include an emissive dopant having a peak wavelength of between 400 to 500 nanometers, but one of the peak wavelength of one of the dopants is at least 4 nm less than the peak wavelength of the other dopant. The first organic emitting layer and the second organic emitting layer may overlap each other, such as being disposed one over the other. The device may be used in white light or multi-color systems.

18 Claims, 9 Drawing Sheets

(56) References Cited

U.S. PATENT DOCUMENTS

| | | | |
|---|---|---|---|
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,868,321 | B2 * | 1/2011 | Lee et al. ............ 257/40 |
| 8,120,020 | B2 * | 2/2012 | Kho et al. ............ 257/40 |
| 8,179,035 | B2 * | 5/2012 | Spindler et al. ...... 313/504 |
| 2003/0230980 | A1 | 12/2003 | Forrest et al. |
| 2004/0174116 | A1 | 9/2004 | Lu et al. |
| 2005/0100760 | A1 * | 5/2005 | Yokoyama ............ 428/690 |
| 2005/0258433 | A1 | 11/2005 | Djurovich et al. |
| 2008/0268282 | A1 * | 10/2008 | Spindler et al. ...... 428/690 |
| 2009/0115952 | A1 * | 5/2009 | Nakamura et al. .... 349/143 |
| 2009/0146552 | A1 * | 6/2009 | Spindler et al. ...... 313/504 |

OTHER PUBLICATIONS

Baldo et al., "Very high-efficiency green organic light-emitting devices based on electrophosphorescence," Appl. Phys. Lett., vol. 75, No. 3, 4-6 (1999).

M. S. Weaver et al., "Phosphorescent OLED-s for displays and lighting," UDC, Proceedings of the International Display Manufacturing Conference, pp. 328-331 (2007).

B. D'Andrade et al., "Blue phosphorescent organic light emitting device stability analysis," UDC, Society for Information Display Digest of Technical Papers 34, 2, pp. 712-715 (2008).

Funahashi et al., "Highly efficient fluorescent deep blue dopant for "Super Top Emission" Device," Society for Information Display Digest of Technical Papers 47. 3, pp. 709-711 (2008).

Baek-woon Lee et al., "Micro-cavity design of RGBW AMOLED for 100% color gamut," Society for Information Display Digest of Technical Papers 68.4, pp. 1050-1053 (2008).

* cited by examiner

FOUR COMPONENT PHOSPHORESCENT OLED FOR COOL WHITE LIGHTING APPLICATION

FIELD OF THE INVENTION

The present invention relates to organic light emitting devices, and more specifically to the use of both light and deep blue organic light emitting compounds in a single device.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

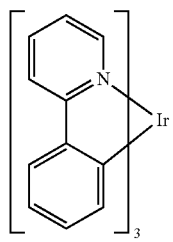

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

This present invention may find applicability in the field of cooler white lighting applications (i.e. a correlated color temperature or CCT>4500K). Cooler white OLED lighting is usually achieved in a stacked architecture by using fluorescent blue material whose efficiency is much lower than phosphorescent materials in general. In the present invention, a phosphorescent deep blue emitter may be applied to build, for example, an all-phosphorescent device that provides energy-star cool white color. Embodiments may include, for example, the use of fluorescent deep blue and/or fluorescent light blue, in addition to the all phosphorescent and the phosphorescent/fluorescent combinations. Also, when used in a single stack structure, aspects of the invention show very good color stability during the aging process.

According to aspects of the present subject matter, a solution to build highly-efficient, long-lived all phosphorescent OLEDs for cool white lighting applications (CCT>4500K) may be provided. For example, instead of using only one blue emitter, structures described herein apply both a deep blue emitter and another light blue emitter (which is usually used for warm white emission) to a single device. The deep blue is usually less efficient and with shorter lifetime compared to lighter blue emitters for warm white OLEDs. Thus the combination of two blue emitters in the device has been found by the inventors to enhance the efficiency and lifetime of the cool white OLED. Exemplary structures according to aspects of the invention have also been found to have good color stability after aging. An advantage of placing a deep blue emitter next to R/G EML and lighter B EML is that it has been found to provide energy transfer from the deep blue color to red-green color and lighter blue color. Thus, the energy transfer allows the aging speed of these monochrome colors to remain almost the same during the aging process, and provides minimal change in the white color afterwards.

According to first aspects of the invention, embodiments may include a light emitting system with a first organic light emitting device. The first organic light emitting device may include an anode, a cathode, a first organic emitting layer disposed between the anode and the cathode, and a second organic emitting layer disposed between the anode and the cathode. In embodiments, the first organic emitting layer may include a first emissive dopant having a peak wavelength of between 400 to 500 nanometers, and the second organic emitting layer may include a second emissive dopant having a peak wavelength of between 400 to 500 nanometers, wherein the peak wavelength of the first emissive dopant is at least 4 nm less than the peak wavelength of the second emissive dopant.

As used herein, "emitters," "emitting layers," and "emissive dopants" should be understood as encompassing those structures and materials that are intended to emit in the actual device(s). That is, although some structures and/or materials may exhibit incidental and/or unintended emissions at a certain low-level (e.g. less than 5% of photons emitted), such emissions are not considered to fall within the claimed "emitters," "emitting layers," or "emissive dopants" unless specifically indicated. To the extent that emissive dopants are claimed, they should also not be considered as including, or corresponding to, the host material, even in the event that the host itself is emissive or exhibits incidental emissions. That is, an "emissive dopant" is generally used to identify a minority component that is intended to emit in the device (e.g. greater than 5% of the photons emitted). Emission from the hole and/or electron transport layers are generally not considered as falling within the definition either.

In embodiments, the first organic emitting layer and the second organic emitting layer may overlap at least partially in plan view. That is, the first organic emitting layer and the second organic emitting layer may overlap partially, substantially completely, or completely, when viewed in a direction perpendicular to the substrate.

Embodiments may also include a third organic emitting layer disposed between the anode and the cathode. The third organic emitting layer may include a third emissive dopant having a peak wavelength of greater than 500 nanometers.

In embodiments, the first organic emitting layer, the second organic emitting layer, and the third organic emitting layer may overlap at least partially in plan view. In embodiments, the first emissive dopant and the second emissive dopant may be disposed one over the other. In embodiments, the first organic light emitting device may be configured such that the first emissive dopant and the second emissive dopant are only activated together.

In other embodiments, the only organic emitting layers in the first organic light emitting device may be the first organic emitting layer and the second organic emitting layer. For example, the first organic light emitting device may be a substantially blue emitter. In embodiments, the system may also include a second organic light emitting device and/or a third organic light emitting device configured to emit light having wavelengths of greater than 500 nanometers. For example, the first organic emitting device may be joined together with other color emitters to form a multi-color pixel.

In embodiments, the first emissive dopant may have a peak wavelength of between 400 to 470 nanometers, and the second emissive dopant may have a peak wavelength of between 460 to 500 nanometers.

In embodiments, the first emissive dopant may be disposed vertically adjacent to the second emissive dopant, and/or vertically adjacent to a third emitting layer, the third emitting layer comprising a third emissive dopant having a peak wavelength of greater than 500 nanometers.

In embodiments, the first organic light emitting device may be a white light emitter, including a plurality of different spectrum emitting layers stacked over one another. In embodiments, the plurality of different spectrum emitting layers may include one or more (e.g. one, two, three, four etc.) emissive dopants having peak wavelengths of greater than 500 nanometers.

In embodiments, a CCT of the system may be >4500K.

According to further aspects of the invention, a light emitting system may include an organic light emitting device including an anode, a cathode, a first organic emitting layer disposed between the anode and the cathode, and a second organic emitting layer disposed between the anode and the cathode. In embodiments, the first organic emitting layer may include a first emissive dopant having a peak wavelength of between 400 to 470 nanometers, and the second organic emitting layer may include a second emissive dopant having a peak wavelength of between 460 to 500 nanometers, wherein the first emissive dopant and the second emissive dopant are disposed one over the other in a stack of layers of the first organic light emitting device.

In embodiments, the organic light emitting device may also include a third organic emitting layer, disposed between the anode and the cathode, comprising a third emissive dopant having a peak wavelength of greater than 500 nanometers.

In embodiments, the first organic emitting layer, the second organic emitting layer, and the third organic emitting layer may overlap at least partially in plan view.

In embodiments, the only organic emitting layers in the first organic light emitting device may be the first organic emitting layer and the second organic emitting layer.

In embodiments, the first organic layer may be disposed in a first stack and the second organic layer may be disposed in a second stack, the first and second stacks disposed one over the other. As used herein, separate "stacks" may include their own electron transport layers (ETL), blocking layers (BL), hole transport layers (ETL), and/or hole injection layers (HIL), in addition to the different emitting layers. The stacks may be separated by, for example, a charge generation layer (CGL) or an electrode. The two stacks can be considered to be OLEDs in series with one another and stacked vertically.

In embodiments, at least one of the first organic layer and the second organic layer may be disposed vertically adjacent to a third organic emitting layer, the third organic emitting layer may include a third emissive dopant having a peak wavelength of greater than 500 nanometers.

In embodiments, the first organic emitting layer may be disposed vertically adjacent to a third organic emitting layer, the third organic emitting layer comprising a third emissive dopant having a peak wavelength of greater than 500 nanometers, and the second organic emitting layer may be disposed vertically adjacent to a fourth organic emitting layer, the fourth organic emitting layer comprising a fourth emissive dopant having a peak wavelength of greater than 500 nanometers.

In embodiments, the first organic light emitting device may be configured such that the first emissive dopant and the second emissive dopant are only activated together.

In embodiments, the first organic light emitting device may be a white light emitter, including a plurality of different spectrum emitting layers stacked over one another.

In embodiments, the plurality of different spectrum emitting layers may include one or more emissive dopants (e.g. one, two, three, four etc.) having a peak wavelength of greater than 500 nanometers.

In embodiments, a CCT of the system may be >4500K.

According to further aspects of the invention, devices such as those described herein may be provided in, for example, a multi-color pixel, or a white-light application. Exemplary devices may be included in a system that includes only one type of emitter, e.g. a white light emitter in a cool white light system, or they may be included with other color emitters, such as a second organic light emitting device and/or a third organic light emitting device, each of which may represent different color pixels of a color display, e.g. an RGB display.

Unless otherwise specified, a first organic light emitting device as described herein will generally refer to a substantially white or blue emitter. Second, third, or other number, organic light emitting devices may be understood as emitting substantially other colored light, such as red light or green light.

As used herein, "red" means having a peak wavelength in the visible spectrum of 600-700 nm, "green" means having a peak wavelength in the visible spectrum of 500-600 nm. Other color emitters are also contemplated as within the scope of the invention.

As used herein, "light blue" and "dark blue" may both generally refer to having a peak wavelength of between 400 to 500 nanometers. In embodiments, a peak wavelength of between 400 to 470 nanometers may refer to "deep blue" and a peak wavelength of between 460 to 500 may refer to "light blue." However, "light blue" and "deep blue" may also be used in the relative sense when comparing emissive dopants included in the same device. For example, the "light blue dopant" may be understood as the dopant having a peak wavelength that is (1) between 400 to 500 nanometers, and (2) greater than (e.g. at least 4 nm greater than) the peak wavelength of another dopant having a peak wavelength of between 400 to 500 (i.e. the "dark blue dopant").

Any first, second or third organic light emitting devices described herein each have at least one emissive layer that includes a phosphorescent or fluorescent organic material that emits light when an appropriate voltage is applied across the device.

Any first, second or third organic light emitting devices described herein may have the same surface area, or may have different surface areas. In embodiments, similar types of organic light emitting devices may be arranged in a uniform pattern and/or different types of organic light emitting devices may be arranged in a quad pattern, in a row, or in some other pattern.

The device may be a consumer product, or included in a consumer product, such as, for example, a display, a television, an organic lighting device, etc.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
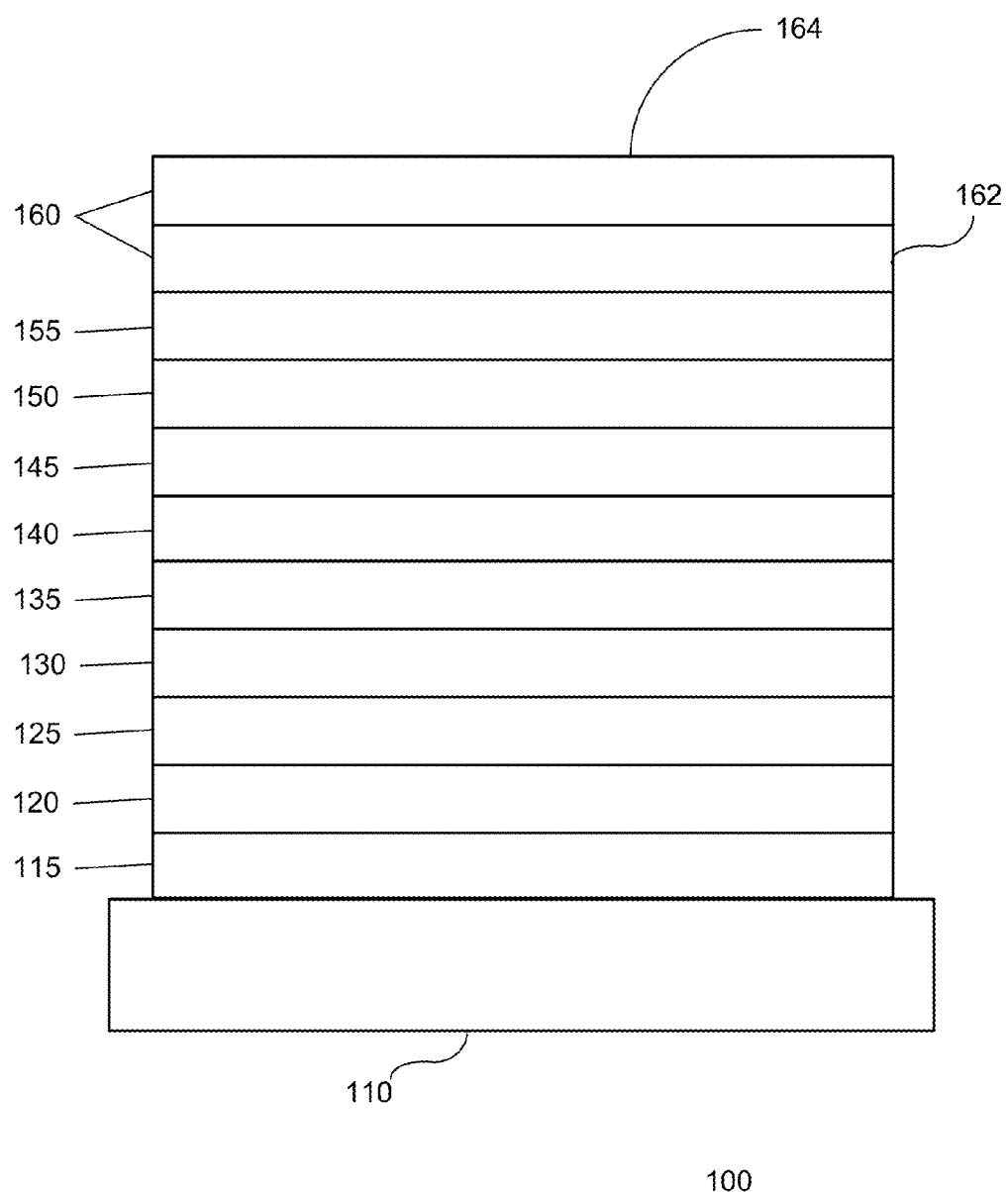
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_{4}$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
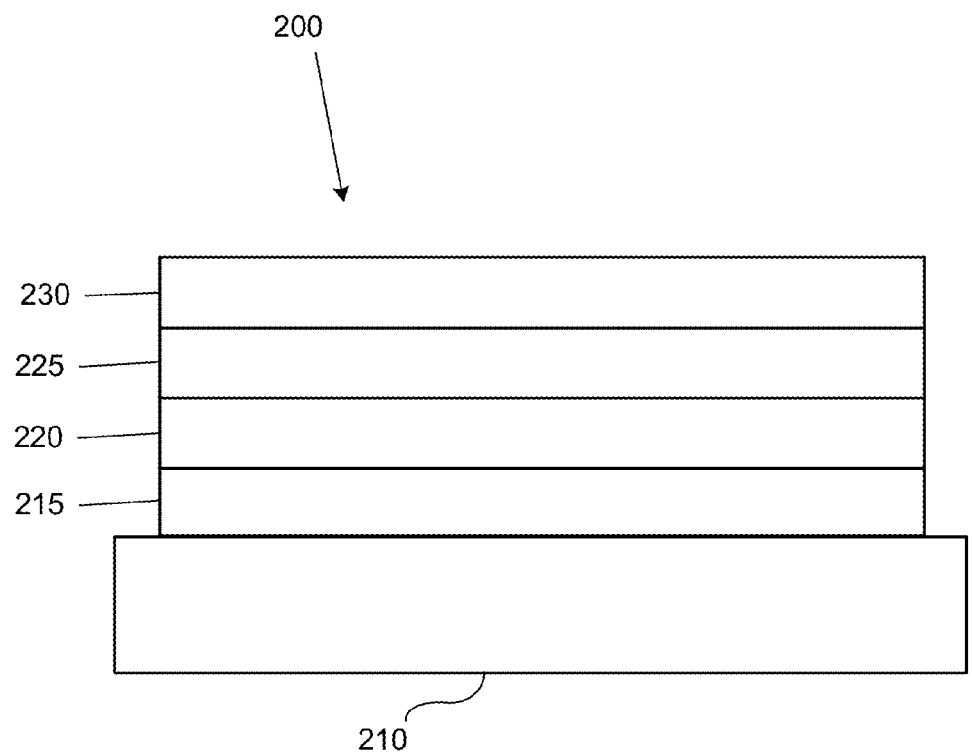
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including lights for interior or exterior illumination and/or signaling, laser printers, flat panel displays, computer monitors, televisions, billboards, heads up displays, fully transparent displays, flexible displays, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One application for phosphorescent emissive molecules is a full color display, preferably an active matrix OLED (AMOLED) display. One factor that currently limits AMOLED display lifetime and power consumption is the lack of a commercial blue phosphorescent OLED with saturated CIE coordinates.

Figure 3:
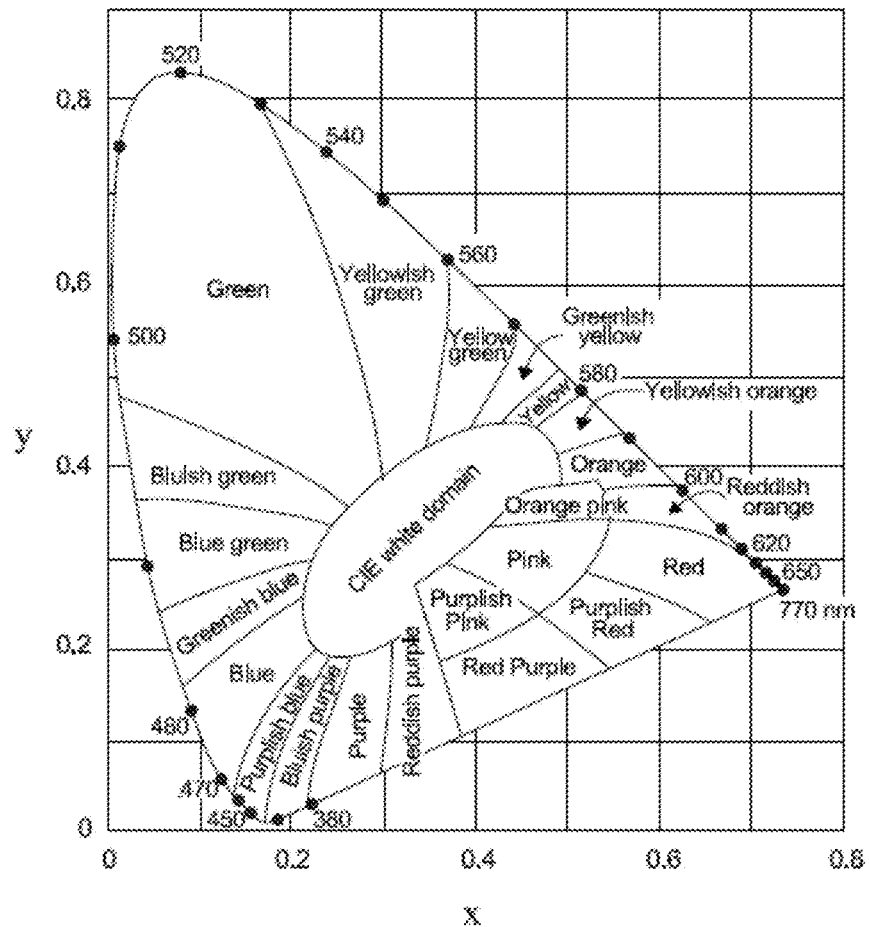
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 4:
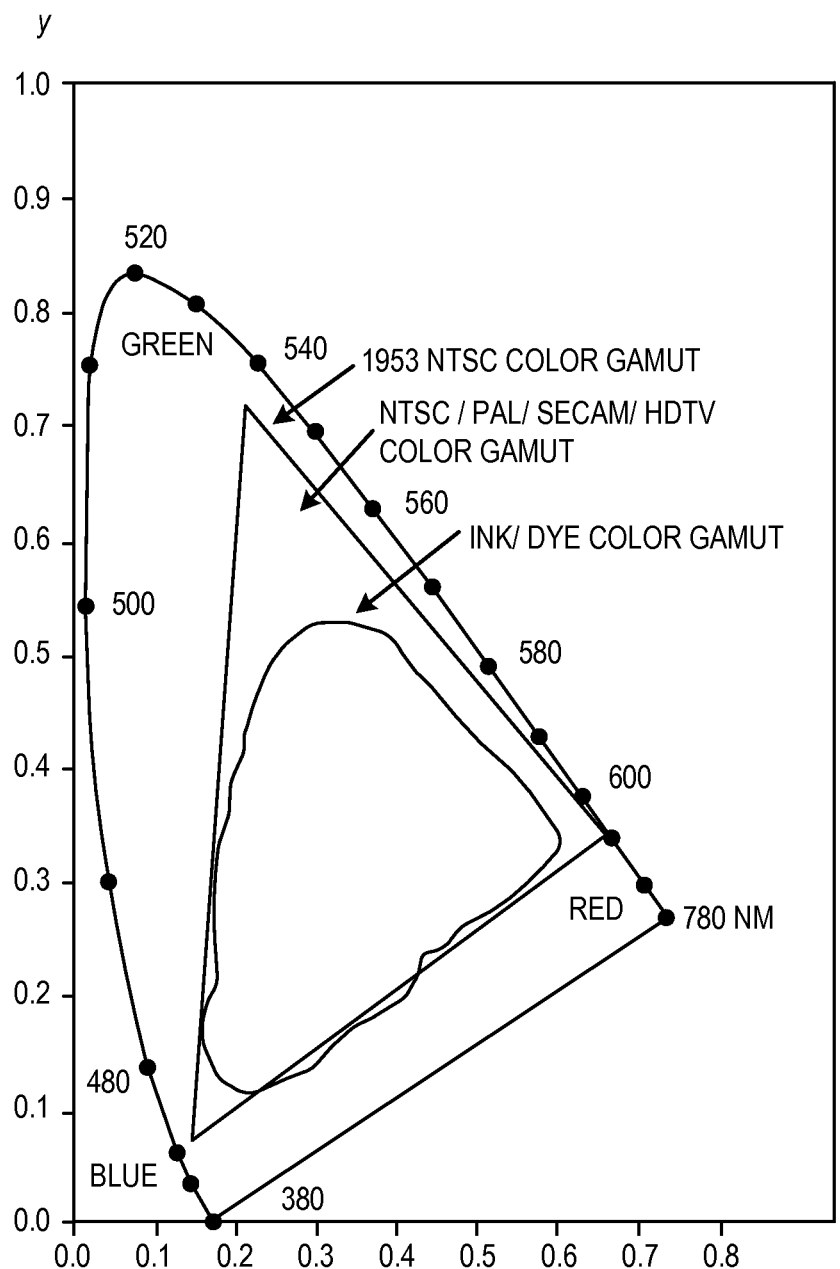
FIG. 4 shows a rendition of the 1931 CIE chromaticity diagram that also shows color gamuts.

FIG. 4 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 4 represent industry standard CIE coordinates for displays. For example, the three points of the triangle labeled "NTSC/PAL/SECAM/HDTV gamut" represent the colors of red, green and blue (RGB) called for in the sub-pixels of a display that complies with the standards listed. A pixel having sub-pixels that emit the RGB colors called for can render any color inside the triangle by adjusting the intensity of emission from each subpixel.

A full color display using phosphorescent OLEDs is desirable for many reasons, including the theoretical high efficiency of such devices, cost advantages, and device flexibility. While the industry has achieved red and green phosphorescent devices that have high efficiency and long lifetimes suitable for use in displays, there may still be issues with blue phosphorescent devices, and particularly blue phosphorescent devices that have the CIE coordinates called for by industry standards such as HDTV and NTSC. The CIE coordinates called for by NTSC standards are: red (0.67, 0.33); green (0.21, 0.72); blue (0.14, 0.08). There are devices having suitable lifetime and efficiency properties that are close to the blue called for by industry standards, but far enough from the standard blue that the display fabricated with such devices instead of the standard blue would have noticeable shortcomings in rendering blues. The blue called for industry standards is a "deep" blue as defined below, and the colors emitted by efficient and long-lived blue phosphorescent devices are generally "light" blues as defined below.

Additionally, there is an ongoing need for white light (including cool white) emitting devices with improved efficiency and extended lifetime. As described further below, aspects of the invention may find applicability, and provide improvements, in both multi-color and white light applications.

Figure 5B:
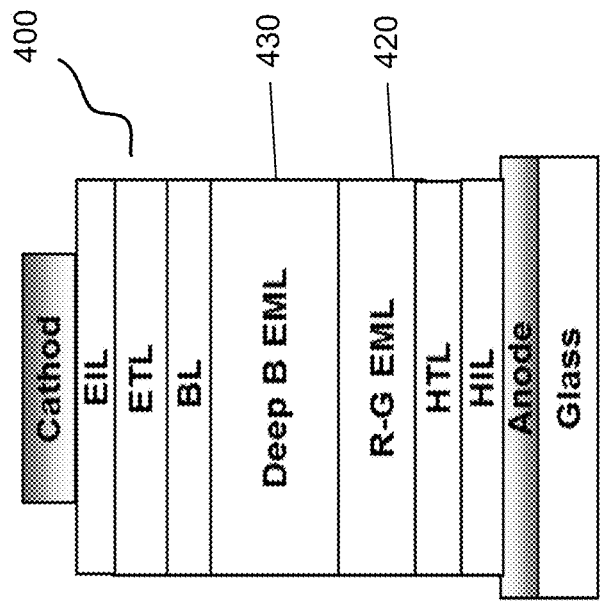
FIG. 5B shows a comparative organic light emitting device structure.
Figure 5A:
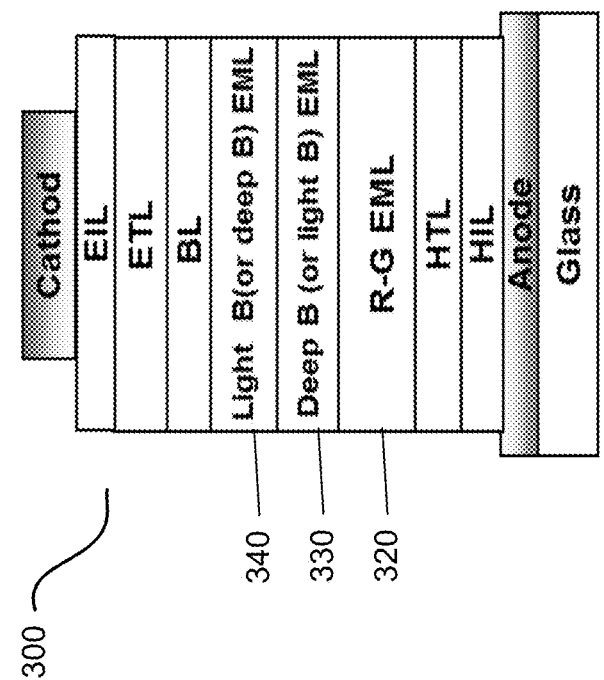
FIG. 5A shows an organic light emitting device with a structure according to aspects of the invention.

FIG. 5A shows an organic light emitting device 300 according to aspects of the invention, and FIG. 5B shows a comparative device structure. The 4-emitter cool white device 300 shown in FIG. 5A has a hole transport, R/G emissive layer 320, deep blue (DB) emissive layer 330 and a light blue (LB) emissive layer 340, as well as electron transport layer on the top. It is noted that, according to other embodiments of the invention, layers 330 and 340 may be switched, that is layer 330 may include the light blue emissive material, and layer 340 may include the deep blue emissive material.

FIG. 5B shows a 3-emitter device 400 including a R/G emissive layer 420. However, instead of having two blue emissive layer as in the device 300 of FIG. 5A, the device 400 shown in FIG. 5B only contains one deep blue emissive layer 430 whose thickness equals to the sum of two blue emissive layers 330 and 340 in FIG. 5A. This was done for the purpose of consistency in the test data.

As will be appreciated, the emissive layers 320, 330 and 340 of device 300 shown in FIG. 5A all at least partially overlap in plan view (not shown), and are activated together when voltage is applied across the device (i.e. between the anode and cathode). The DB emitting layer 330 may include a first emissive dopant having a peak wavelength of between 400 to 500 nanometers, or more preferably between 400 to 470 nanometers, and the LB emitting layer 340 may include a second emissive dopant also having a peak wavelength of between 400 to 500 nanometers, or more preferably between 460 to 500 nanometers. According to aspects of the invention, the first emissive dopant of the DB emitting layer 330 may be selected such that the peak wavelength is at least 4 nm less than the peak wavelength of the emissive dopant included in the LB emitting layer 340.

As used herein, "red" means having a peak wavelength in the visible spectrum of 600-700 nm, "green" means having a peak wavelength in the visible spectrum of 500-600 nm, "light blue" typically means having a peak wavelength in the visible spectrum of 460-500 nm, and "deep blue" typically means having a peak wavelength in the visible spectrum of 400-470 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 460-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.3, preferably less than 0.2, and most preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

More generally, "light blue" may mean having a peak wavelength in the visible spectrum of 400-500 nm, and "deep blue" may mean having a peak wavelength in the visible spectrum of 400-500 nm., and at least 4 nm less than the peak wavelength of the light blue. In some circumstances, embodiments of the invention may be described as including "a blue EML" and "the other blue EML" to generally refer to a LB EML and a DB EML, or vice versa.

In another embodiment, "light blue" may mean having a CIE y coordinate less than 0.25, and "deep blue" may mean having a CIE y coordinate at least 0.02 less than that of "light blue."

In another embodiment, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations. In any event, embodiments of the invention include two different blue emitters in a single device, however the difference in blue is measured.

Returning to FIG. 5A, it is also noted that, although emitting layer 320 is identified as an R/G emitter, other color emitters with peak wavelengths over 500 nanometers may be used. Likewise, the R/G EML may also be more than one layer, i.e. R and G may be located in separate discreet layers. The exact order of the 3 or more EMLs may also be different than shown in the Figures. Alternatively, emitting layer 320 may be omitted entirely, resulting in a substantially blue emitting device including only DB and LB emitting layers.

Figure 6:
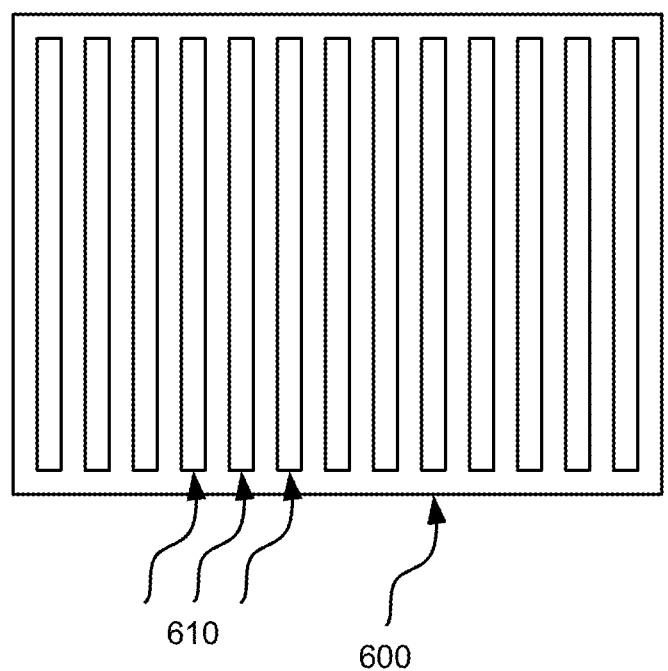
FIG. 6 depicts an exemplary white light panel according to aspects of the invention.
Figure 7:
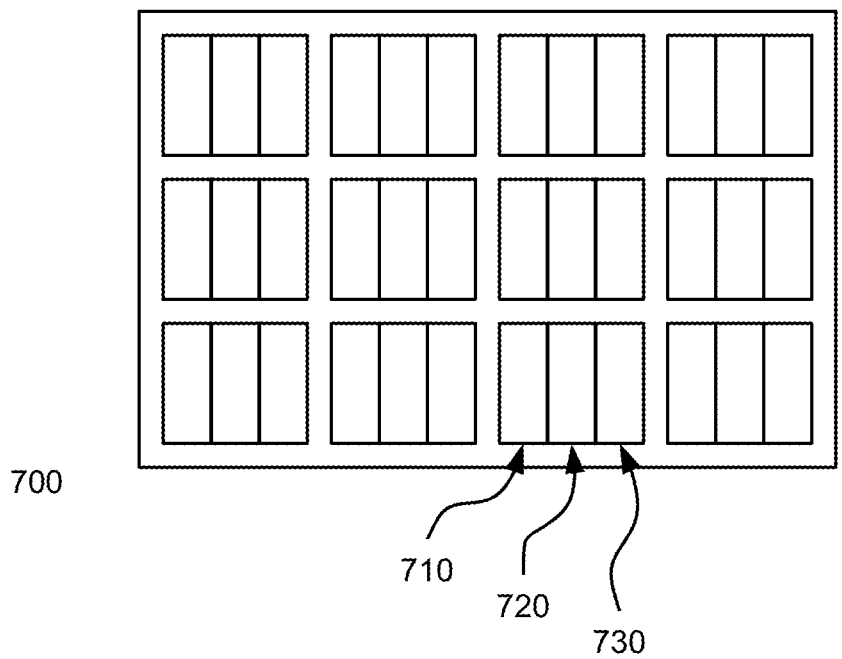
FIG. 7 depicts an exemplary full-color display according to aspects of the invention.

Different types of devices may be used in different lighting applications. For example, a white lighting panel 600, such as shown in FIG. 6, may include a plurality of similar white lighting devices 610 (in this case white light emitting strips), which may be configured in a similar manner to, for example, the device 300 shown in FIG. 5A. On the other hand, as shown in FIG. 7, a substantially blue emitter 710 (such as may result from omitting emitting layer 320 from device 300), may be used together with, for example, a red emitter 720 and a green emitter 730 to form pixels of a multi-color display 700. "Red" and "green" phosphorescent devices having lifetimes and efficiencies suitable for use in a commercial display are well known and readily achievable, including devices that emit light sufficiently close to the various industry standard reds and greens for use in a display. Examples of such devices are provided in M. S. Weaver, V. Adamovich, B. D'Andrade, B. Ma, R. Kwong, and J. J. Brown, Proceedings of the International Display Manufacturing Conference, pp. 328-331 (2007); see also B. D'Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

Other combinations are also possible, and will be appreciated by those of skill in the art. For example, any number of different color combination sub-pixels may be included in the pixel of a multi-color display such as shown in FIG. 7. Additionally, in certain circumstances, it may be advantageous to include both a substantially blue emitting device as described herein with a white emitting device, and/or any number of other color emitting devices.

Figure 8:
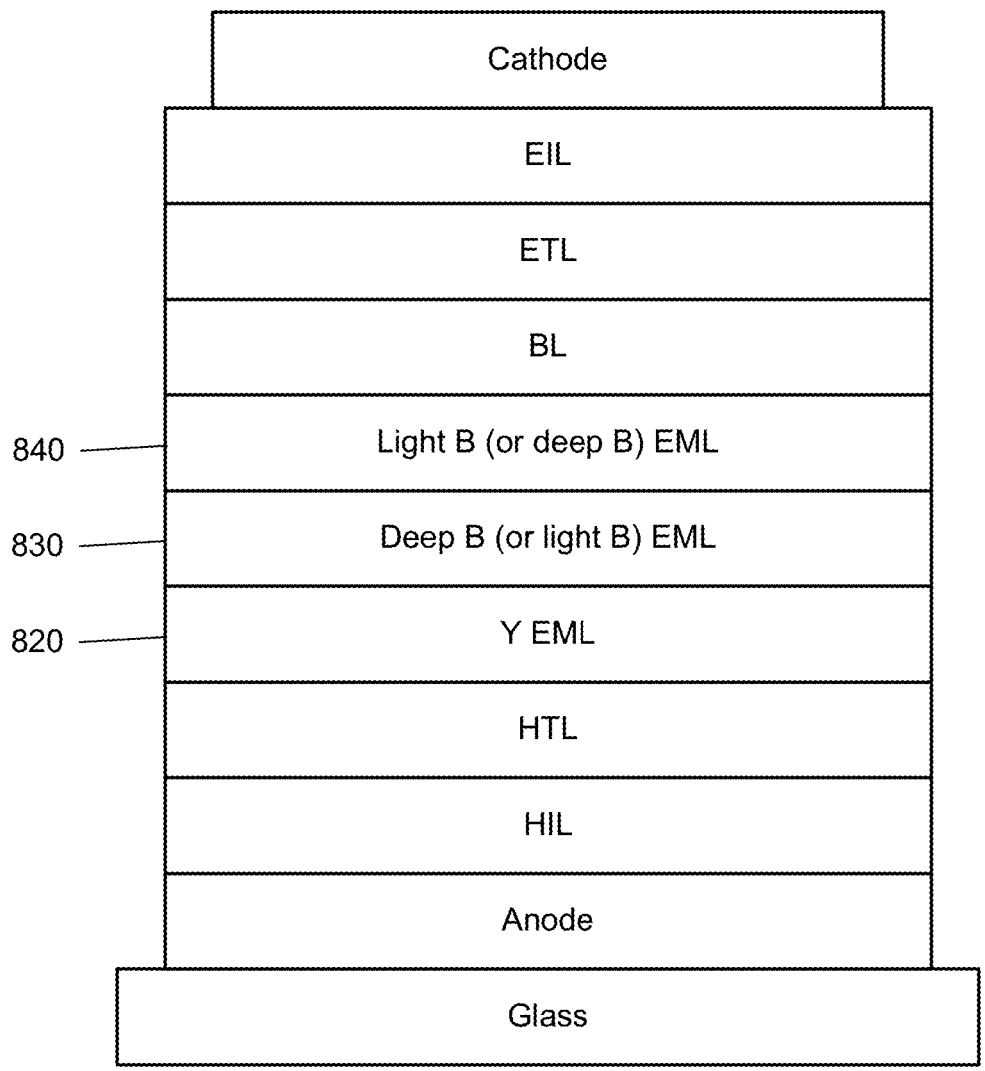
FIG. 8 shows an alternative embodiment of another organic light emitting device with a structure according to aspects of the invention.

FIG. 8 shows yet another example of a device architecture according to aspects of the invention. In this case, a single-stack cool white device with a deep blue EML 830 and a light blue EML 840 is provided, but the R/G EML from the device shown in FIG. 5A has been replaced by a Yellow EML 820. As mentioned with respect to the configuration of FIG. 5A, the DB and LB layers 830, 840 may be deposited in a different order such that the DB is over the LB, if desired.

In this regard, the inventors have found that it may be advantageous from an optical efficiency perspective to place the shortest wavelength EML nearest the cathode and then the other EMLs are placed further from the cathode, arranged in increasing wavelength order. This would be the situation preferred mainly for bottom emitting devices where the cathode is opaque/reflective. Here, the cavity optics would be most favorable from an optical efficiency standpoint. This option assumes that the three or more EMLs would all transport charge in the desired way resulting in the exact required amounts of emission from each layer. However, it is also noted that this may not always be the case as the different EMLs have different charge transport characteristics.

Another benefit of stacking these emitters that the inventors have made discoveries in is the energy transfer between adjacent EMLs. For example, if stacking DB immediately above R/G EML, and LB on top of DB, the inventors have found energy transfer from deep blue to light blue and from deep blue to R/G EML. If the DB and LB are deposited in a different order, which means LB is immediately above R/G EML and DB is on top of LB, then there is energy transfer from DB to LB and from LB to R/G EML. The energy transfer results in unexpectedly favorable color stability during the aging process which meets Energy Star Spec for lighting application.

Figures 9, 10, 11:
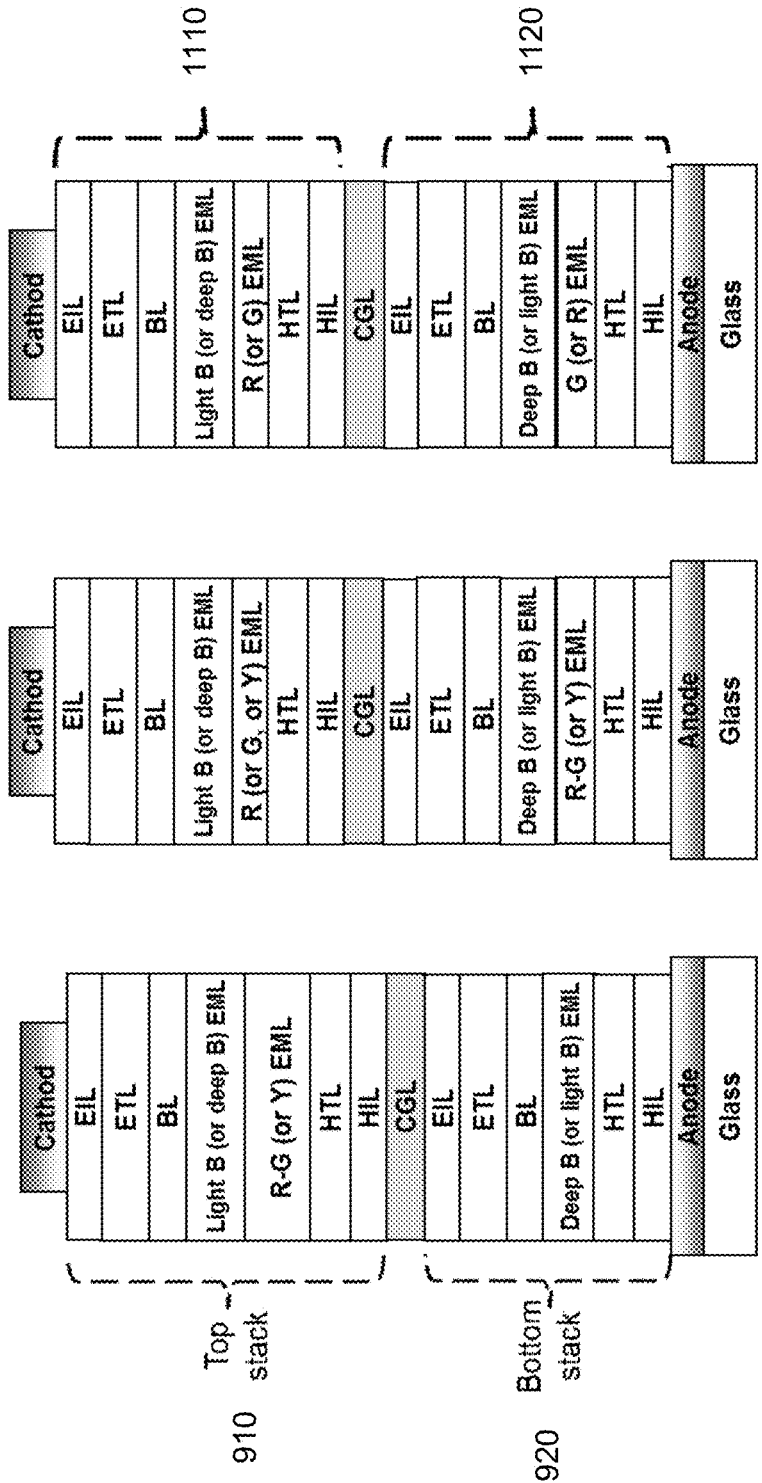
FIGS. 9-11 show alternative embodiments of organic light emitting devices with multi-stack structures according to further aspects of the invention.

FIGS. 9-11 show alternative embodiments according to further aspects of the invention. These embodiments all include a "multi-stack" or "tandem" architecture in which multiple stacks (in these cases two stacks) including EMLs and separate HILs, HTLs, and/or ETLs are included between a common anode and cathode. A charge generation layer (CGL), or another electrode, is typically disposed between the different stacks. A CGL The embodiments shown in FIG. 9-11 all show device structures with two blue components in two stacks, one over the other, to form a cool white device. In the embodiment shown in FIG. 9, a first stack 910 contains a blue EML with R/G (or Y) EML. The second stack 920 contains the other blue EML. For example, first stack 910 may include a light blue emitter and second stack 920 may include a deep blue emitter, or vice versa. As can be seen in FIG. 9, first stack 910 and second stack 920 may each include their own HIL, HTL, and/or ETL.

More generally, devices such as shown in FIG. 9 may include a blue EML in one stack, and a different blue EML and a non-blue EML (i.e. with peak wavelength greater than 500 nanometers) in the other stack.

An alternative structure, such as shown in FIG. 10, may include a blue EML and a non-blue EML in one stack, and a different blue EML and another non-blue EML in the other stack. For example, as shown in FIG. 10, one stack contains a blue EML with red EML while the other stack contains the other blue EML with green EML. Other combinations, such as including multiple non-blue EMLs in one or more stacks, are also possible.

More generally speaking, a cool white device may be made of two vertical stacks. As shown in FIGS. 9 and 10, one stack may contain one blue component (lighter B or deep B EML) with or without R, G or Y EML. The other stack contains another blue EML typically adjacent to an R/G (or Y) EML.

If Red and Green emitters are applied in the device instead of yellow emitter, the cool white stacked device may also be built as FIG. 11. One stack, e.g. 1110, contains a blue EML in adjacent to red EML, while the other stack, e.g. 1120, contains another blue EML adjacent to green EML. The inventors have found that a preferred choice includes the use of phosphorescent red, green and/or yellow emitters. This is not intended to exclude fluorescent emitters for these colors from the scope of the invention, but reflects certain favorable results that the inventors have found.

Comparative Test Results:

"Light blue" phosphorescent devices having desirable lifetime and efficiency properties are readily achievable. Such devices may be used in displays without adversely affecting the lifetime or efficiency of the display. However, a display relying on a light blue device may not be able to properly render colors requiring a deep blue component. An example of a suitable light blue device has the structure: ITO (80 nm)/Compound C (30 nm)/NPD (10 nm)/Compound A: Emitter A (30 nm:20%)/Compound A (5 nm)/LG201 (30 nm)/LiF (1 nm)/Al (100 nm)

LG201 is available from LG Chem. Ltd. of Korea.

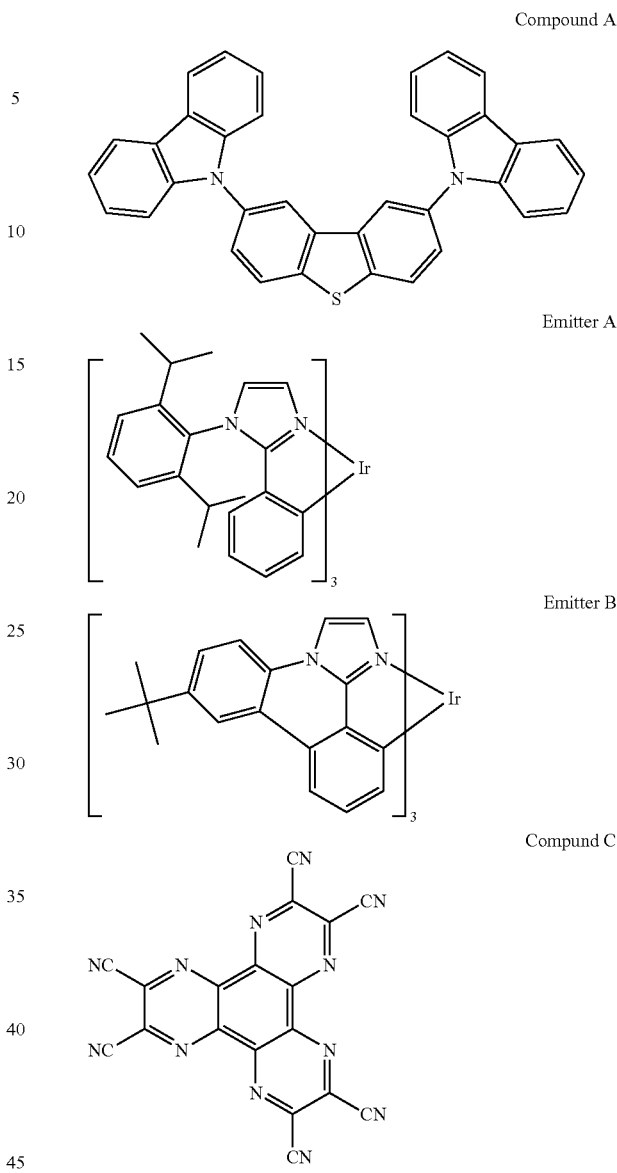

Compound A

Emitter A

Emitter B

Compund C

Such a device has been measured to have a lifetime of 6.3 khrs from initial luminance 1000 nits at constant dc current to 50% of initial luminance, 1931 CIE coordinates of CIE (0.176, 0.377), and a peak emission wavelength of 476 nm in the visible spectrum.

"Deep blue" devices are also readily achievable, but not necessarily having the lifetime and efficiency properties desired for a display suitable for consumer use. One way to achieve a deep blue device is by using a fluorescent emissive material that emits deep blue, but does not have the high efficiency of a phosphorescent device. An example of a deep blue fluorescent device is provided in Masakazu Funahashi et al., Society for Information Display Digest of Technical Papers 47. 3, pp. 709-711 (2008). Funahashi discloses a deep blue fluorescent device having CIE coordinates of (0.140, 0.133) and a peak wavelength of 460 nm. Another way is to use a phosphorescent device having a phosphorescent emissive material that emits light blue, and to adjust the spectrum of light emitted by the device through the use of filters or microcavities. Filters or microcavities can be used to achieve a deep blue device, as described in Baek-woon Lee, Young In Hwang, Hae-yeon Lee and Chi Woo Kim and Young-gu Ju Society for Information Display Digest of Technical Papers 68.4, pp. 1050-1053 (2008), but there may be an associated decrease in device efficiency. Indeed, the same emitter may be used to fabricate a light blue and a deep blue device, due to microcavity differences. Another way is to use available deep blue phosphorescent emissive materials, such as described in United States Patent Publication 2005-0258433, which is incorporated by reference in its entirety and for compounds shown at pages 7-14. However, such devices have been shown to have lifetime issues. An example of a suitable deep blue device using a phosphorescent emitter has the structure:

ITO (80 nm)/Compound C (30 nm)/NPD (10 nm)/Compound A:Emitter B (30 nm:9%)/Compound A (5 nm)/Alq$_3$ (30 nm)/LiF (1 nm)/Al (100 nm)

Such a device has been measured to have a lifetime of 600 hrs from initial luminance 1000 nits at constant dc current to 50% of initial luminance, 1931 CIE coordinates of CIE: (0.148, 0.191), and a peak emissive wavelength of 462 nm.

The difference in the performance of available deep blue and light blue devices may be significant. For example, a deep blue device may have good efficiency, but a lifetime that is less than 50% or less than 25% of that of a light blue device. Such a difference in lifetime may describe many deep blue phosphorescent devices. The same differential may also be true in fluorescent emitters, although their absolute lifetimes may be greater at present than those of phosphorescent emitters.

A standard way to measure lifetime is $LT_{50}$ at an initial luminance of 1000 nits, i.e., the time required for the light output of a device to fall by 50% when run at a constant current that results in an initial luminance of 1000 nits. Or, a deep blue device may have a good lifetime, but an efficiency that is less than 80% or less than 40% of that of a light blue device. Such a difference in efficiency may describe many fluorescent deep blue devices, or deep blue devices obtained by color-shifting the emission from a light blue phosphorescent emitter, for example by using microcavities.

As an initial observation, devices as shown in FIGS. 5A and 5B were fabricated by high vacuum (>10$^{-7}$ Torr) thermal evaporation. The anode electrode was ~800 Å of indium tin oxide (ITO). 10 Å of Liq was used as the electron injection layer (EIL) followed by a cathode of 1,000 Å of Al. All devices were encapsulated with a glass lid sealed with an epoxy resin in a nitrogen glove box (<1 ppm of H$_2$O and O$_2$,) immediately after fabrication, and a moisture getter was incorporated inside the package. Both device examples had organic stacks consisting of, sequentially, from the ITO surface, 100 Å thick hole injection layer (HIL), 200 Å or 300 Å hole transporting layer (HTL), 150 Å of Green and Red emissive layer (EML), followed by a total thickness of 150 Å blue emissive layer. For device shown in FIG. 5A, the blue emissive layer contains a 100 Å thick deep blue emissive layer 330 and a 50 Å light blue emissive layer 340 (deposition order could be switched). For device shown in FIG. 5B, blue emissive layer only consists of a 150 Å thick deep blue emissive layer 430. Each device also consisted of a 50 Å blocking layer (BL) and ~300 Å of an electron transporting layer (ETL). Also, in some cases, the R/G EML in the cool white devices which contains two emitters may also be replaced by Y EML which only includes one yellow emitter, as shown in FIG. 8.

The two devices both contain the same phosphorescent deep blue emitter which will generate a cooler white color (CCT>4500K) in combination with green and red phosphorescent emitters. However, device 5A contains another light blue phosphorescent blue emitter as well whose lifetime and efficiency is superior to the deep blue emitter. Therefore, device 5A will have an improved (~20% higher) luminance efficacy, EQE and power efficacy than device 5B at 1000 cd/m$^2$. The inventors estimated that the EQE contribution of the deep blue component in FIG. 5A is about 16% and in FIG. 5B is about 44% for a ~5000K cool white color. Thus by introducing light blue component into FIG. 5A structure, the EQE contribution of deep blue component has been reduced significantly.

TABLE 1

| CCT: 5000K | In FIG. 5(a) structure | In FIG. 5(b) structure |
|---|---|---|
| Deep B contribution in EQE | 16% | 44% |
| Light B contribution in EQE | 28% | 0% |

Besides the advantage of higher efficiency, the device of 5A is also expected to demonstrate an improved operational stability. The lifetime of the device of 5A is expected to be as much as twice the lifetime of the device of 5B, with a lifetime defined as aged to 70% of its initial luminance (LT70) exceeding 1000 hours from an initial luminance of 1000 cd/m$^2$ for an acceleration factor of 1.5. The single stack architecture of the device of 5A will also show excellent color stability after aging. The inventors expect a Duv<0.007 change, where Duv=$\sqrt{(\Delta u^2 + \Delta v^2)}$ and u and v are the color coordinates in 1976 CIE space, between an unaged device with a device aged to 70% of its initial luminance, which meets the Energy Star Criteria on color shift during aging process. In summary, it was expected that the 4-emitter cool white architecture, such as shown in FIG. 5A, which contains two blue emitters would show an improved efficiency and lifetime compared to the structure with only a deep blue emitter, such as shown in FIG. 5B. The single stack multi-blue structure was also found to demonstrate a minimal color shift during the aging process, which is considered to be particularly advantageous for cool white lighting applications.

Figure 12B:
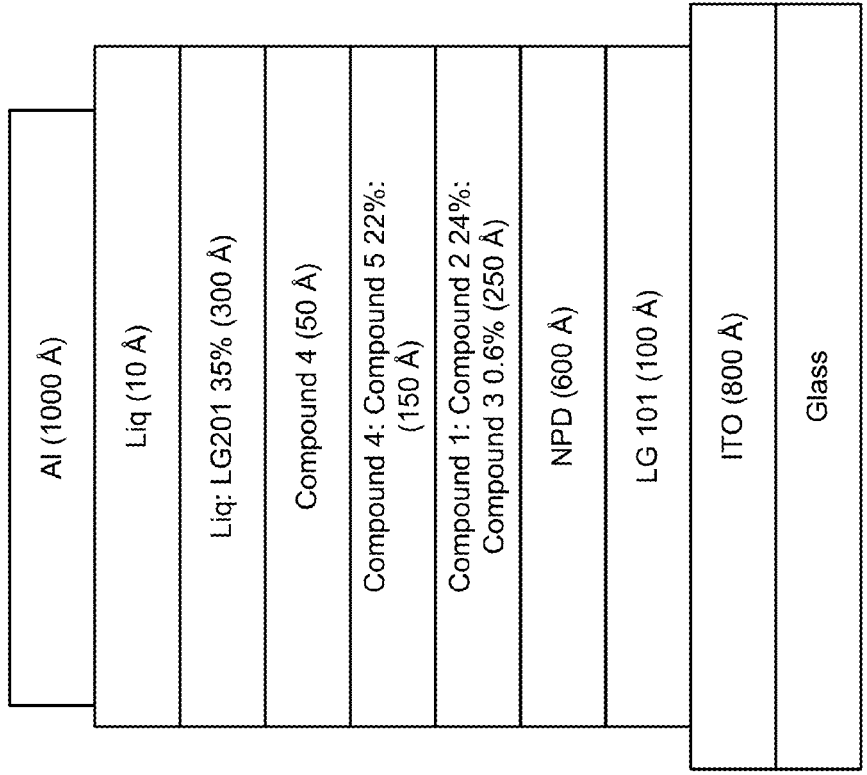
FIG. 12B shows a comparative organic light emitting device structure.
Figure 12A:
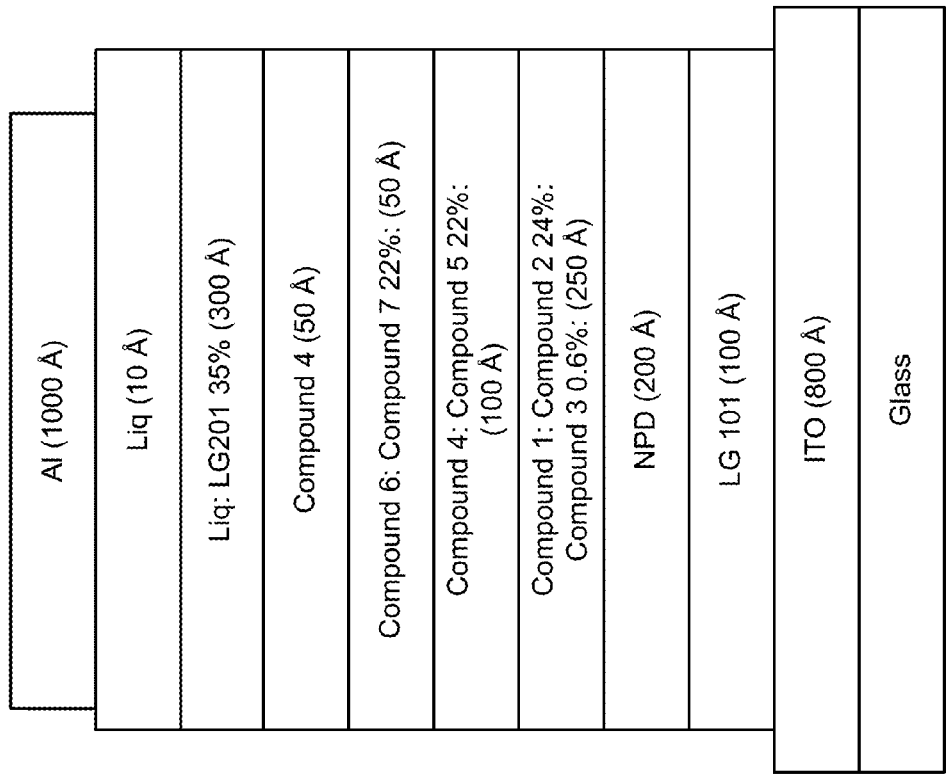
FIG. 12A shows another performance-tested organic light emitting device according to aspects of the invention.

Two additional devices were constructed and subjected to further testing for various performance measures to further confirm the inventors' expectations, as reflected below in Table 2. In particular, the devices were manufactured as follows. Device A, shown in FIG. 12A, was a four-emitter (RGBB) cool white device including an anode (800 Å ITO), a hole injection layer (100 Å of LG101, available from LG Chemicals of Korea), a hole transport layer (200 Å of NPD), a first emissive layer (250 Å of host Compound 1 doped with 24% Compound 2 and 0.6% Compound 3), a second emissive layer (100 Å host Compound 4 doped with 22% Compound 5), a third emissive layer (50 Å host Compound 6 doped with 22% Compound 7), a fourth emissive layer (50 ÅCompound 4), a layer (300 Å Liq (lithium quinolate) and 35% LG201, available from LG Chemicals of Korea), an EIL (10 Å thick layer of Liq) and a cathode (1000 Å thick layer of Al). Device B, shown in FIG. 12B, was a three emitter (RGB) cool white device including an anode (800 Å ITO), a hole injection layer (100 Å of LG101, available from LG Chemicals of Korea), a hole transport layer (600 Å of NPD), a first emissive layer (250 Å of host Compound 1 doped with 24% Compound 2 and 0.6% Compound 3), a second emissive layer (150 Å host Compound 4 doped with 22% Compound 5), a third emissive layer (50 Å Compound 4), a layer (300 Å Liq (lithium quinolate) and 35% LG201, available from LG Chemicals of Korea), an EIL (10 Å thick layer of Liq) and a cathode (1000 Å thick layer of Al).

TABLE 2

| At 3,000 nits | 4-emitter cool white | 3-emitter cool white |
|---|---|---|
| Power Efficacy [lm/W] | 24 | 19 |
| EQE [%] | 18.2 | 14.9 |
| Voltage [V] | 4.6 | 4.7 |
| 1831 CIE | (0.349, 0.362) | (0.348, 0.350) |
| Duv | 0.004 | 0.002 |
| CCT [K] | 4,904 | 4,880 |
| LT70 [hrs] | 170 | 60 |

As shown in Table 2, compared with 3-emitter cool white architecture of Device B, the 4-emitter cool white device A which has two blue components show a 26% improvement in power efficacy and 22% increase in EQE. They both have a ~4900K color temperature and have similar voltage. Lifetime of 4-emitter Device A, LT70 when device ages to 70% of its original luminance, is about 3 times of LT70 of 3-emitter Device B.

Compound 4

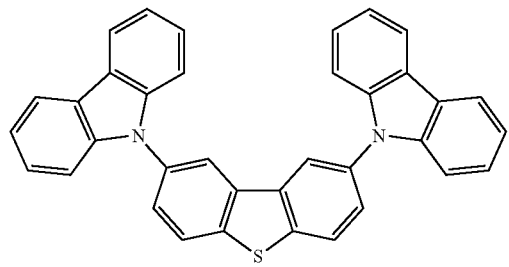

Compound 6

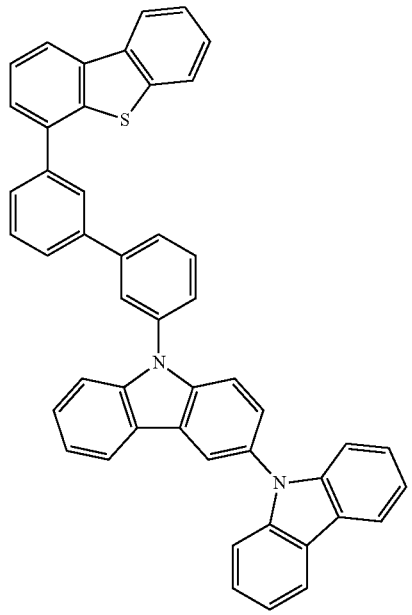

Compound 7

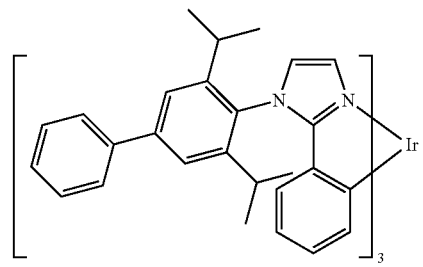

Compound 5

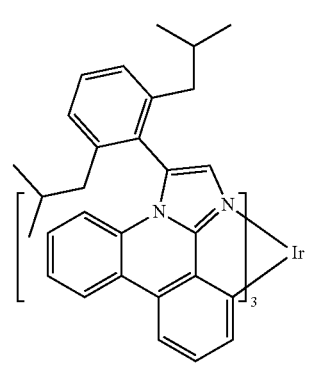

Compound 2

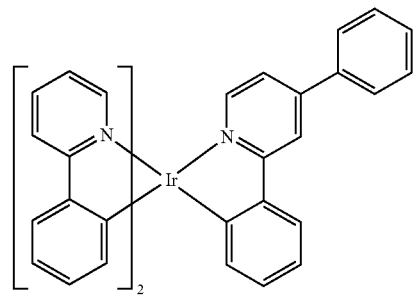

Compound 3

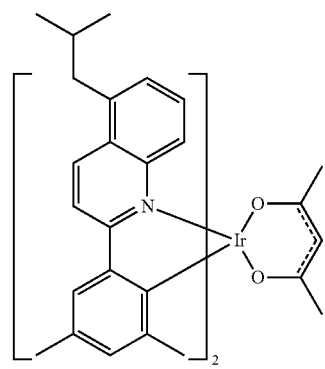

Compound 1

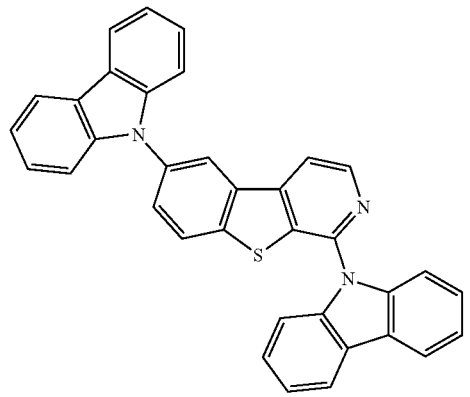

NPD

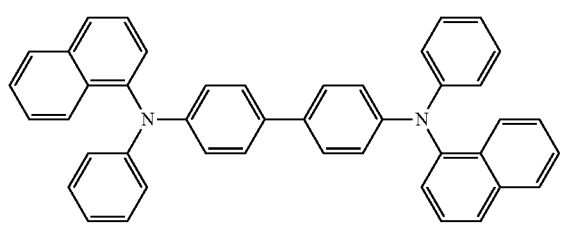

Other configurations may be used. For example, a stacked OLED with four separately controllable emissive layers, or two stacked OLEDs each with two separately controllable emissive layers, may be used to achieve four subpixels that can each emit a different color of light.

Various types of OLEDs may be used to implement various configurations, including transparent OLEDs and flexible OLEDs.

Displays with devices having lighting devices, in any of the various configurations illustrated and in other configurations, may be fabricated and patterned using any of a number of conventional techniques. Examples include shadow mask, laser induced thermal imaging (LITI), ink jet printing, organic vapor jet printing (OVJP), or other OLED patterning technology.

A single pixel may incorporate three or more sub-pixels such as those disclosed herein, possibly with more than three discrete colors. Systems including the described lighting devices may include mostly blue light emitting devices, non-blue emitting devices, white light emitting devices, and combinations thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A light emitting system comprising a first organic light emitting device, the first organic light emitting device including:
    an anode;
    a cathode;
    a first organic emitting layer, disposed between the anode and the cathode, comprising a first emissive dopant having a peak wavelength of between 400 to 500 nanometers; and
    a second organic emitting layer, disposed between the anode and the cathode, comprising a second emissive dopant having a peak wavelength of between 400 to 500 nanometers, wherein the peak wavelength of the first emissive dopant is at least 4 nm less than the peak wavelength of the second emissive dopant,
    wherein the only organic emitting layers in the first organic light emitting device are the first organic emitting layer and the second organic emitting layer.

2. The system of claim 1, wherein the first organic emitting layer and the second organic emitting layer overlap at least partially in plan view.

3. The system of claim 1, further comprising at least a second organic light emitting device and a third organic light emitting device, each of the second and third light emitting devices configured to emit light at wavelengths of greater than 500 nanometers.

4. The system of claim 1, wherein the first emissive dopant has a peak wavelength of between 400 to 470 nanometers, and the second emissive dopant has a peak wavelength of between 460 to 500 nanometers.

5. The system of claim 4, wherein the first emissive dopant is disposed vertically adjacent to the second emissive dopant.

6. The system of claim 1, wherein the first emissive dopant and the second emissive dopant are disposed one over the other.

7. The system of claim 1, wherein the first organic light emitting device is configured such that the first emissive dopant and the second emissive dopant are only activated together.

8. The system of claim 1, wherein the first organic light emitting device is a white light emitter, including a plurality of different spectrum emitting layers stacked over one another.

9. The system of claim 1, wherein CCT of the system is >4500K.

10. A light emitting system comprising a first organic light emitting device, the first organic light emitting device including:
    an anode;
    a cathode;
    a first organic emitting layer, disposed between the anode and the cathode, comprising a first emissive dopant having a peak wavelength of between 400 to 470 nanometers; and
    a second organic emitting layer, disposed between the anode and the cathode, comprising a second emissive dopant having a peak wavelength of between 460 to 500 nanometers;
    wherein the first emissive dopant and the second emissive dopant are disposed one over the other in a stack of layers of the first organic light emitting device, and
    wherein the only organic emitting layers in the first organic light emitting device are the first organic emitting layer and the second organic emitting layer.

11. The system of claim 10, wherein the first organic layer is disposed in a first stack and the second organic layer is disposed in a second stack, the first and second stacks disposed one over the other.

12. The system of claim 10, wherein the first organic light emitting device is configured such that the first emissive dopant and the second emissive dopant are only activated together.

13. The system of claim 10, wherein the first organic light emitting device is a white light emitter, including a plurality of different spectrum emitting layers stacked over one another.

14. The system of claim 10, wherein CCT of the system is >4500K.

15. The system of claim 1, wherein the first emissive dopant comprises a phosphorescent blue emitter and the second emissive dopant comprises a phosphorescent blue emitter.

16. The system of claim 1, wherein the second organic emitting layer is separated from the first organic emitting layer by at least one charge generation layer (CGL).

17. The system of claim 10, wherein the second organic emitting layer is separated from the first organic emitting layer by at least one charge generation layer (CGL).

18. The system of claim 10, further comprising at least a second organic light emitting device and a third organic light emitting device, each of the second and third light emitting devices configured to emit light at wavelengths of greater than 500 nanometers.

* * * * *